US010199403B2

(12) United States Patent
Hyung et al.

(10) Patent No.: US 10,199,403 B2
(45) Date of Patent: Feb. 5, 2019

(54) LIQUID CRYSTAL DISPLAY PANEL HAVING A FIRST COLUMN, A SECOND COLUMN, AND A FOURTH COLOR FILTER MADE OF A SAME MATERIAL

(71) Applicant: Samsung Display Co., Ltd., Yongin (KR)

(72) Inventors: Yong Woo Hyung, Suwon-si (KR); Young Goo Song, Asan-si (KR); Hyong Cheol Lee, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 372 days.

(21) Appl. No.: 14/711,089

(22) Filed: May 13, 2015

(65) Prior Publication Data

US 2016/0195750 A1 Jul. 7, 2016

(30) Foreign Application Priority Data

Jan. 6, 2015 (KR) ........................ 10-2015-0000947

(51) Int. Cl.

*G02F 1/1362* (2006.01)
*H01L 27/12* (2006.01)
*G02F 1/1333* (2006.01)

(52) U.S. Cl.

CPC ........ *H01L 27/1259* (2013.01); *G02F 1/1362* (2013.01); *G02F 1/133345* (2013.01); *G02F 1/136209* (2013.01); *G02F 2001/136222* (2013.01)

(58) Field of Classification Search

CPC ........................................... G02F 2001/136222
See application file for complete search history.

(56) References Cited

U.S. PATENT DOCUMENTS 5,642,176 A * 6/1997 Abukawa .......... G02F 1/133514 349/106
2005/0122445 A1* 6/2005 Park .................. G02F 1/133514 349/106
2008/0018836 A1* 1/2008 Huh .................. G02F 1/133516 349/106
2008/0316413 A1 12/2008 Cho
2011/0149224 A1* 6/2011 Tseng ................ G02F 1/134309 349/142
2012/0268353 A1 10/2012 Mizukoshi et al.
2012/0268354 A1 10/2012 Mizukoshi et al.
2012/0326950 A1 12/2012 Park et al.
2015/0138470 A1* 5/2015 Kang .................... G02F 1/1368 349/42

FOREIGN PATENT DOCUMENTS

KR 10-2007-0073094 7/2007
KR 10-2007-0077677 7/2007
KR 10-2010-0081504 7/2010
KR 10-2013-0001628 1/2013

* cited by examiner

*Primary Examiner* — Paul Lee
(74) *Attorney, Agent, or Firm* — H.C. Park & Associates, PLC

(57) ABSTRACT

A liquid crystal display panel includes a first substrate and a second substrate facing each other, a liquid crystal layer disposed between the first substrate and the second substrate, and color filters disposed on the first substrate, each color filters respectively configured to transmit light of one of first through fourth colors, in which at least one of the color filters includes at least one column protruding from the first substrate.

6 Claims, 15 Drawing Sheets

LIQUID CRYSTAL DISPLAY PANEL HAVING A FIRST COLUMN, A SECOND COLUMN, AND A FOURTH COLOR FILTER MADE OF A SAME MATERIAL

CROSS-REFERENCE TO RELATED APPLICATION

This application claims priority from and the benefit of Korean Patent Application No. 10-2015-0000947, filed on Jan. 6, 2015, which is hereby incorporated by reference for all purposes as if fully set forth herein.

BACKGROUND

Field

Exemplary embodiments of the present invention relate to a liquid crystal display (LCD) panel including columns and a method of manufacturing the same.

Discussion of the Background

With the development of multimedia, the importance of display devices has increased. Accordingly, various types of display devices such as liquid crystal displays (LCDs) and organic electroluminescent display devices may be used.

In an LCD, an electric field may be applied to a liquid crystal material having negative dielectric anisotropy that is injected between two substrates. The LCD may adjust the amount of light (from an external light source) transmitting through the substrates by controlling an intensity of the electric field to obtain a desired image signal.

The LCD may include color filters to emit red light, green light, and blue light. More particularly, the color filters may receive white light from a backlight unit and convert the white light into the red light, the green light, and the blue light, such that a desired image may be displayed on an LCD panel in response to data signals transmitted to the LCD panel. Research on improving lateral visibility of an LCD and reducing a change of color in an image displayed on the LCD when viewed from the side of the LCD is currently being conducted.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a liquid crystal display (LCD) panel with improved lateral visibility by reducing a step difference between color filters and an LCD including the LCD panel.

Exemplary embodiments of the present invention also provide a simplified method of manufacturing an LCD panel.

Additional aspects will be set forth in the detailed description which follows, and, in part, will be apparent from the disclosure, or may be learned by practice of the inventive concept.

According to an exemplary embodiment of the present invention, a liquid crystal display (LCD) panel includes a first substrate and a second substrate facing each other, a liquid crystal layer disposed between the first substrate and the second substrate, and color filters disposed on the first substrate, each color filter respectively configured to transmit light of one of first through fourth colors, in which at least one of the color filters comprise at least one column protruding from the first substrate.

According to an exemplary embodiment of the present invention, a liquid crystal display panel includes a first substrate and a second substrate facing each other, a liquid crystal layer disposed between the first substrate and the second substrate, a data line and a gate line disposed to intersect each other on the first substrate, a pixel disposed at an intersecting area of the data line and the gate line, the pixel including color filters and columns, in which each color filter is configured to transmit light of one of first through fourth colors, at least one of the color filter comprises columns protruding from the second substrate, and a height of the columns are substantially similar to the color filters, with respect to the second substrate.

According to an exemplary embodiment of the present invention, a method of manufacturing a liquid crystal display panel includes preparing a thin-film transistor array substrate and a second substrate facing the thin-film transistor array substrate, forming second, third, and fourth color filters respectively transmitting light of second, third, and fourth colors on the thin-film transistor array substrate or the second substrate, forming one or more columns in a first area on the thin-film transistor array substrate or the second substrate, and forming a first color filter transmitting light of a first color on the first area.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
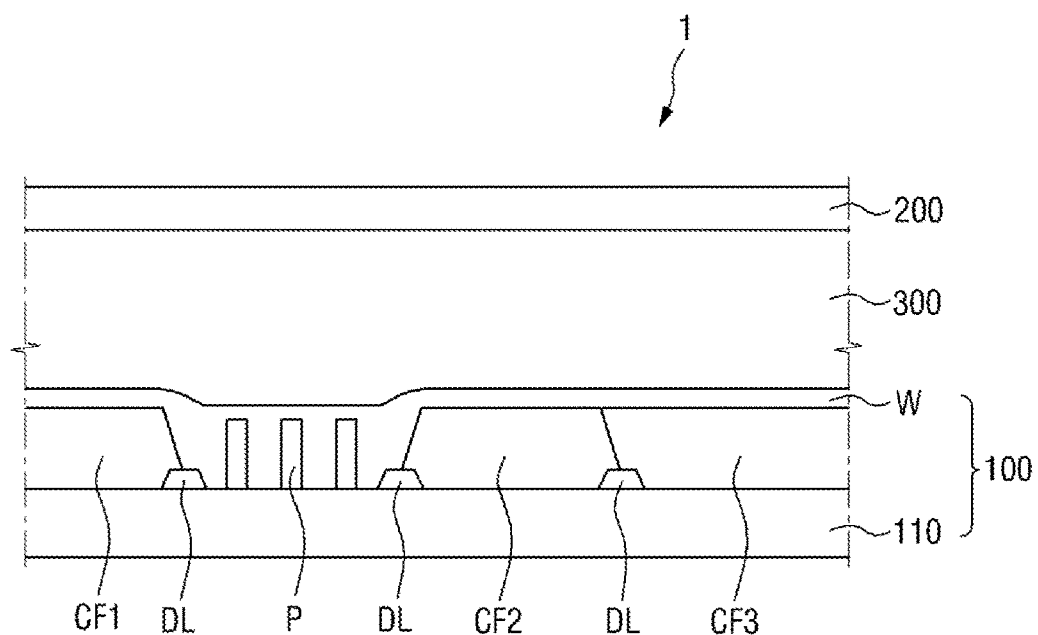
FIG. 1 is a schematic cross-sectional view of a liquid crystal display (LCD) panel according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic cross-sectional view of a liquid crystal display (LCD) panel 1 according to an exemplary embodiment of the present invention.

Referring to FIG. 1, an LCD panel 1 according to an exemplary embodiment of the present invention may include a first substrate 110 and a second substrate 200 facing each other, a liquid crystal layer 300 interposed between the first substrate 110 and the second substrate 200, and color filters (CF1, CF2, CF3, and W) formed on the first substrate 110 and emit light of first through fourth colors. Any one of the color filters (CF1, CF2, CF3, and W) which emit the light of the first through fourth colors may include one or more columns P protruding from the first substrate 110.

As will be described later, since any one of the color filters (CF1, CF2, CF3, and W) which emit the light of the first through fourth colors includes one or more columns P, the color filter including the columns P may be formed without using a mask, and a step difference between the color filters not including the columns P may be reduced.

A large step difference between color filters may cause a yellowish phenomenon in which an image displayed appears yellowish when viewed from a side of an LCD. According to an exemplary embodiment of the present invention, the step difference between the color filters may be compensated for by the columns P to improve the yellowish phenomenon.

According to an exemplary embodiment of the present invention, the columns P may be included in the color filter W that emits the light of the fourth color, and the light of the fourth color may be white light. In addition, the color filters CF1, CF3, and CF3 may be color filters which emit red light, green light, and blue light, i.e., the light of the first color, the light of the second color, and the light of the third color, respectively. The color filters (CF1, CF2, CF3, and W) which emit the red light, the green light, the blue light, and the white light may be combined to produce an image of a color substantially similar to green, thereby improving visibility.

More specifically, the LCD panel 1 of FIG. 1 may include the liquid crystal layer 300 interposed between the first substrate 110 and the second substrate 200 and the color filters (CF1, CF2, CF3, and W) formed on the first substrate 110. According to an exemplary embodiment of the present invention, the LCD panel 1 of FIG. 1 may include the color filter CF1 which emits the red light, the color filter W which emits the white light, the color filter CF2 which emits the green light, and the color filter CF3 which emits the blue light.

As illustrated in FIG. 1, the color filter W which emits the white light may be formed on the color filters CF1, CF3, and CF3 which emit the light of the first through third colors, to cover the color filters CF1, CF2, and CF3. More particularly, the color filters CF1, CF3, and CF3 which emit the light of the first through third colors may be interposed between the color filter W which emits the white light and the first substrate 110. In addition, the color filter W may be located between color filters which emit light of different colors.

The columns P may be made of the same material as any one of the color filters CF1, CF3, and CF3 which emit the light of the first through third colors. As described above, the columns P may be formed in the color filter W which emits the white light, and the columns P formed in the color filter W may be made of the same material as any one of the materials that form the color filters CF1, CF3, and CF3 which emit the light of the first through third colors. Accordingly, the color filter W which emits the white light may produce light of a color substantially similar to any one of the red, green or blue color, so that an image may be displayed in a color substantially similar to a color desired by a user.

According to an exemplary embodiment of the present invention, the columns P may be made of the same material as the color filter CF3 which emits the blue light, such that the overall color of an image displayed on the LCD panel 1 is substantially similar to blue.

The first substrate 110 including the color filters (CF1, CF2, CF3, and W) may be a thin-film transistor (TFT) array substrate 100. The TFT array substrate 100 will now be described with reference to FIG. 2, FIG. 3, and FIG. 4.

Figure 2:
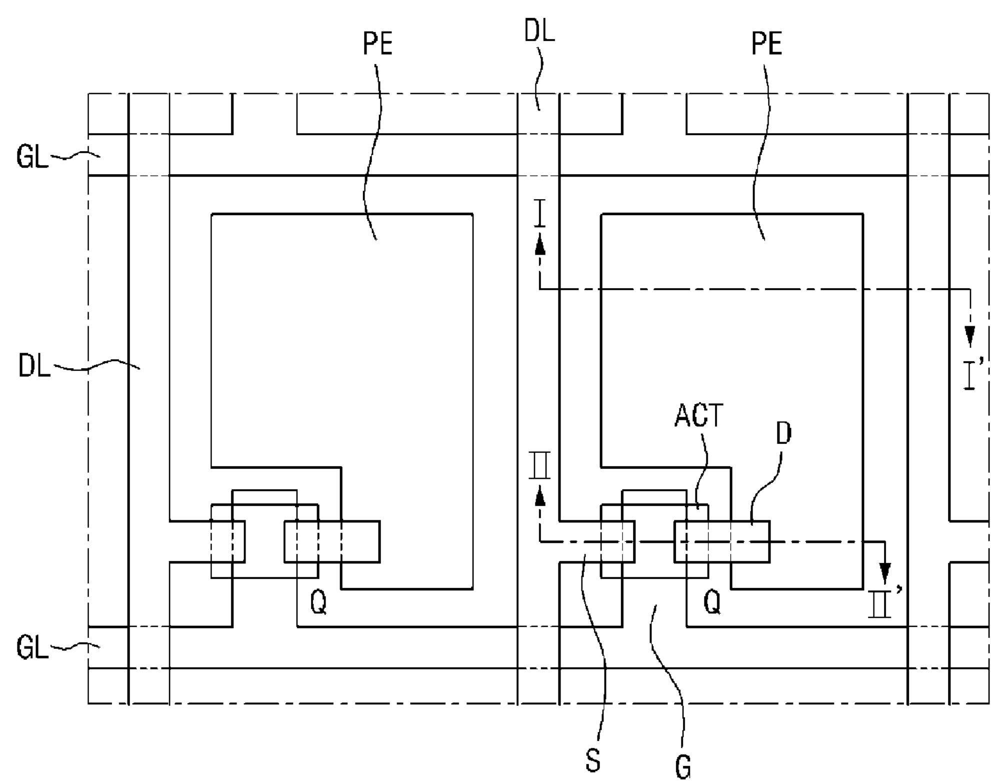
FIG. 2 is a plan view of a thin-film transistor (TFT) array substrate for display devices according to an exemplary embodiment of the present invention.
Figure 3:
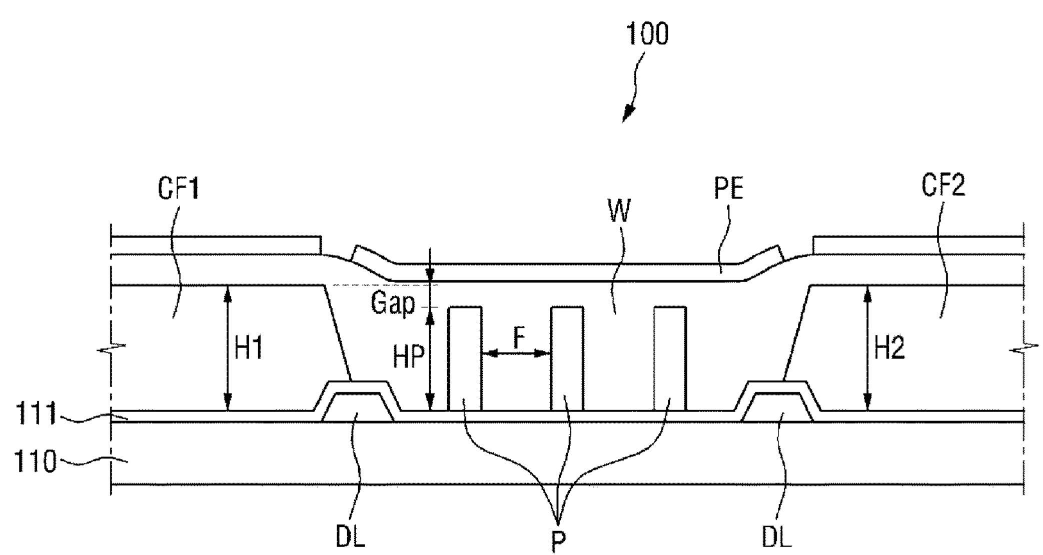
FIG. 3 is a cross-sectional view taken along the line I-I' of FIG. 2.
Figure 4:
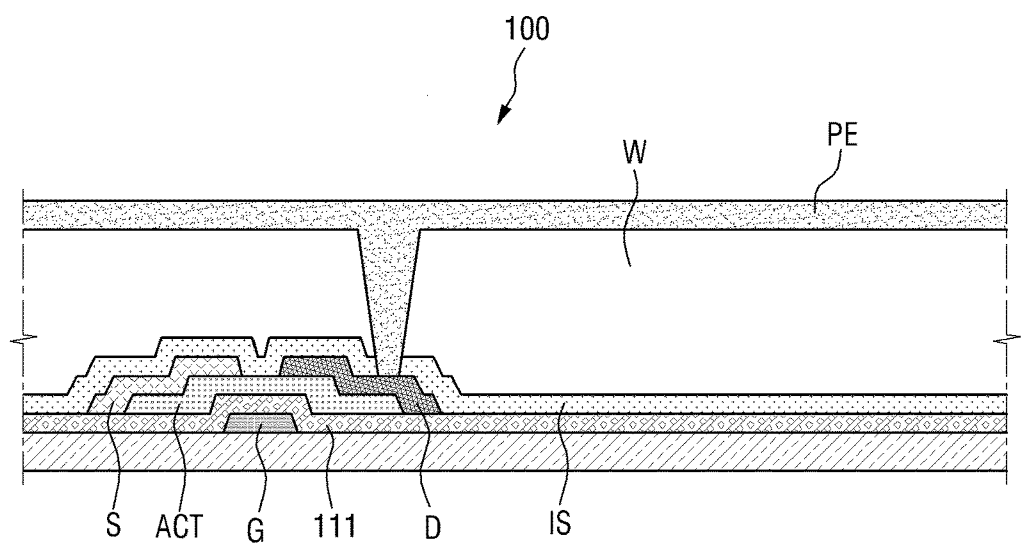
FIG. 4 is a cross-sectional view taken along the line II-IF of FIG. 2.

FIG. 2 is a plan view of a TFT array substrate 100 for display devices according to an exemplary embodiment of the present invention. FIG. 3 is a cross-sectional view taken along the line I-I' of FIG. 2. FIG. 4 is a cross-sectional view taken along the line II-IF of FIG. 2.

Referring to FIGS. 2 through 4, the TFT array substrate 100 may include TFTs and a pixel electrode PE located on each of the TFTs.

The TFT array substrate 100 may include a gate electrode G and a data line DL located on a first substrate 110 and a gate insulating layer 111 located on the gate electrode G, the data line DL, and the first substrate 110. A semiconductor layer ACT may be located on at least a region of the gate insulating layer 111 which overlaps the gate electrode G, and a source electrode S and a drain electrode D may be located on the semiconductor layer ACT to be separated from each other. A passivation layer IS may be located on the gate insulating layer 111, the source electrode S, the semiconductor layer ACT, and the drain electrode D. The pixel electrode PE may be located on the passivation layer IS and electrically connected to the drain electrode D via a contact hole which at least partially exposes the drain electrode D. In addition, a color filter (CF1, CF2, CF3, or W) may be formed between the pixel electrode PE and the passivation layer IS.

The gate electrode G, the data line DL, the gate insulating layer 111, the semiconductor layer ACT, the source electrode S, the drain electrode D, and the passivation layer IS formed on the first substrate 110 to display an image are collectively referred to as a TFT, and the first substrate 110 and the TFT formed on the first substrate 110 are collectively referred to as the TFT array substrate 100.

Each of the color filters (CF1, CF2, CF3, and W) may be formed between the pixel electrode PE and the first substrate 110. According to the present exemplary embodiment, the color filters (CF1, CF2, CF3, and W) are formed on the TFT array substrate 100, and the pixel electrode PE is directly formed on each of the color filters (CF1, CF2, CF3, and W). Therefore, an error range between each of the color filters (CF1, CF2, CF3, and W) and the pixel electrode PE may be minimized, thereby reducing the leakage of light.

The color filters (CF1, CF2, CF3, and W) may include a red color filter, a green color filter, a blue color filter, and a white color filter. The material that forms each of the color filters (CF1, CF2, CF3, and W) may be known to those of ordinary skill in the art, and thus a more detailed description thereof will be omitted.

The first substrate 110 may be made of an insulating material. For example, the first substrate 110 may be made of a hard material such as glass, or plastic resin such as polycarbonate resin. Alternatively, the first substrate 110 may be made of a flexible material such as polyimide resin. More particularly, the material that forms the first substrate 110 may be selected as desired.

Referring to FIG. 3, the color filters (CF1, CF2, CF3, and W) may be formed in different pixels. The pixels may be divided by gate lines GL and data lines DL that intersect each other, and the color filters (CF1, CF2, CF3, and W) may be formed to correspond to the pixels.

The pixel electrode PE may be formed on each of the color filters (CF1, CF2, CF3, and W) to correspond to each of the color filters (CF1, CF2, CF3, and W). The passivation layer IS may be formed between the color filters (CF1, CF2, CF3, and W) and the first substrate 110 to cover the data lines DL and the first substrate 110. The passivation layer IS may be made of an insulating material.

One or more columns P having a pillar shape may protrude from the first substrate 110 toward a second substrate 200. As illustrated in FIG. 3, a height of each of the columns P included in any one of the color filters (CF1, CF2, CF3, and W) which emit light of first through fourth colors may be equal to or smaller than those of the other color filters. More particularly, a height HP of each of the columns P from the first substrate 110 may be smaller than heights of adjacent color filters CF1 and CF2 or different from the heights of the adjacent color filters CF1 and CF2 by a predetermined gap as illustrated in FIG. 3.

Since the columns P are included in any one of the color filters (CF1, CF2, CF3, and W), the color filter that includes the columns P may be formed by deposition without using a photoresist process. In addition, the columns P may compensate for a step difference between the adjacent color filters CF1 and CF2, thereby preventing the yellowish phenomenon.

The color filter W including the columns P may be a color filter which emits white light. More particularly, the color filter W may be a transparent material that may transmit light emitted from thereunder. The color filter W including the columns P may be filled with the transparent material and the transparent material may also be formed on other color filters CF1, CF2, and CF3. The transparent material that fills the color filter W including the columns P and other color filters CF1, CF2, and CF3 may have relatively little effect on the colors of light emitted from the color filters CF1, CF2, and CF3.

The columns P may be made of the same material as the materials that form the color filters CF1, CF2, and CF3 and the color filter W including the columns P. When the color filter W including the columns P is a white color filter made of a transparent material, the columns P may be made of the same material as any one of the red, green and blue color filters CF1, CF2, and CF3.

According to an exemplary embodiment of the present invention, if the columns P are made of the material that forms the blue color filter CF3, the color filter W which is filled with a transparent material and includes the columns P may emit light of a color substantially similar to blue as well as white light. Accordingly, an LCD may display an image of a color substantially similar to blue. In this case, the displayed image may also appear bluish when viewed from the side of the LCD, which may improve the yellowish phenomenon and realize a superior color.

According to an exemplary embodiment of the present invention, the columns P may be made of the material that forms a color filter of a second color different from the blue color, to adjust the overall color of an image substantially similar to the second color of the color filter.

The columns P may include two or more columns. A distance F between a first column P and a second column P may be in a range of 10 to 40 μm, for example, in a range of 20 to 30 μm. If the distance F between the columns P is 10 μm or less, the unique color of the color filter W including the columns P may be excessively discolored, resulting in reduced transmittance. On the other hand, if the distance F between the columns P is more than 40 μm, a step difference between the color filter W including the columns P and an adjacent color filter may increase. Therefore, the yellowing phenomenon may be observed from the side.

Although not illustrated, an insulating layer may further be provided on the color filers (CF1, CF2, CF3, and W). The insulating layer may cover all of the color filters (CF1, CF2, CF3, and W). The insulating layer may prevent each of the color filters (CF1, CF2, CF3, and W) from being damaged in the process of forming the pixel electrode PE on each of the color filters (CF1, CF2, CF3, and W).

Figure 5:
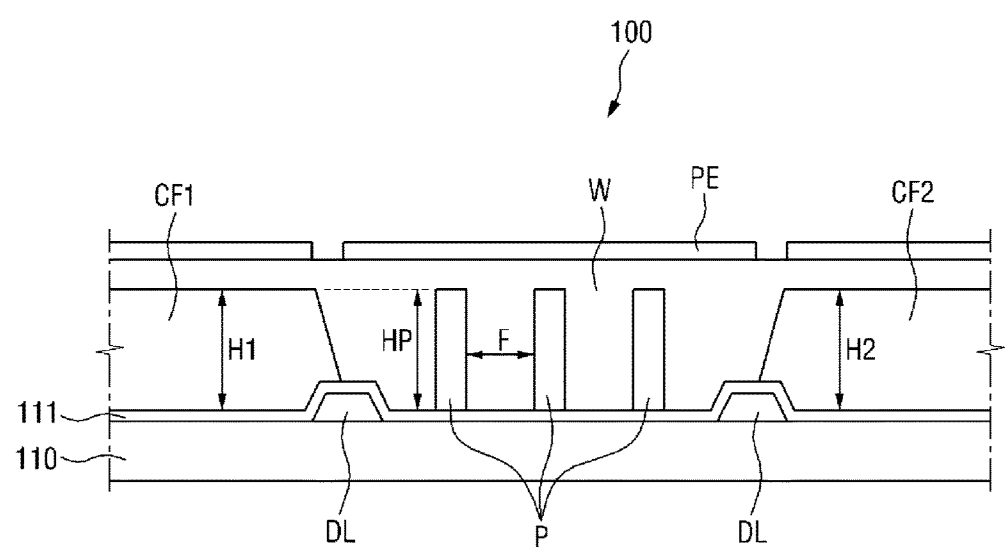
FIG. 5 is a cross-sectional view taken along the line I-I' of FIG. 2 according to an exemplary embodiment of the present invention.

FIG. 5 is a cross-sectional view taken along the line I-I' of FIG. 2 according to an exemplary embodiment of the present invention. A TFT array substrate 100 illustrated in FIG. 5 may have substantially similar elements as the TFT array substrate illustrated with reference to FIG. 3, and accordingly, repeated description thereof will be omitted. Referring to FIG. 5, a height HP of one or more columns P of an LCD panel may be equal to a height H1 of each of color filters CF1, CF2, and CF3 without the columns P. Since the height HP of each of the columns P is equal to those of adjacent color filters CF1, CF2, and CF3, the color filters CF1, CF2, and CF3 may have an improved flatness as a whole to display an image with a desired color.

Figure 6:
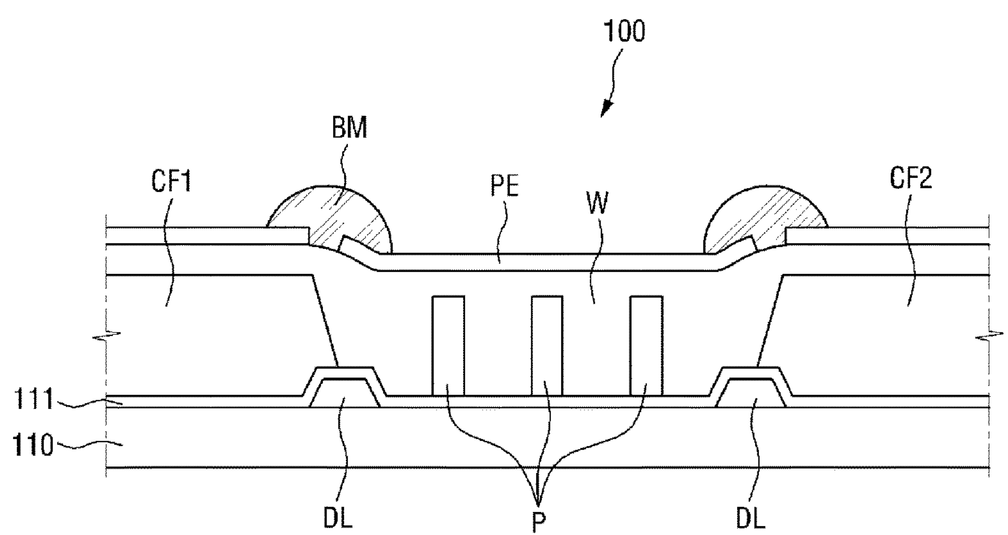
FIG. 6 is a cross-sectional view taken along the line I-I' of FIG. 2 according to an exemplary embodiment of the present invention.

FIG. 6 is a cross-sectional view taken along the line I-I' of FIG. 2 according to an exemplary embodiment of the present invention. Referring to FIG. 6, an LCD panel may include a black matrix BM formed on color filters (CF1, CF2, CF3, and W) which emit light of first through fourth colors and at boundaries between the color filters (CF1, CF2, CF3, and W).

The black matrix BM may be formed at the boundaries between color filters which emit light of different colors and on the color filters. In addition, a pixel electrode PE may be formed between each of the color filters (CF1, CF2, CF3, and W) and the black matrix BM. Further, since the color filter W including one or more columns P is formed on other color filters CF1, CF2, and CF3 to cover the color filters CF1, CF2, and CF3, a portion of the color filter W including the columns P may be formed between each of the color filters CF1, CF2, and CF3 and the black matrix BM.

The black matrix BM may prevent color mixing between the pixels. The black matrix BM may be located at portions corresponding to gate electrodes G and data lines DL and portions corresponding to TFTs. The black matrix BM may be known to those of ordinary skill in the art, and thus a more detailed description thereof is omitted.

Figure 7:
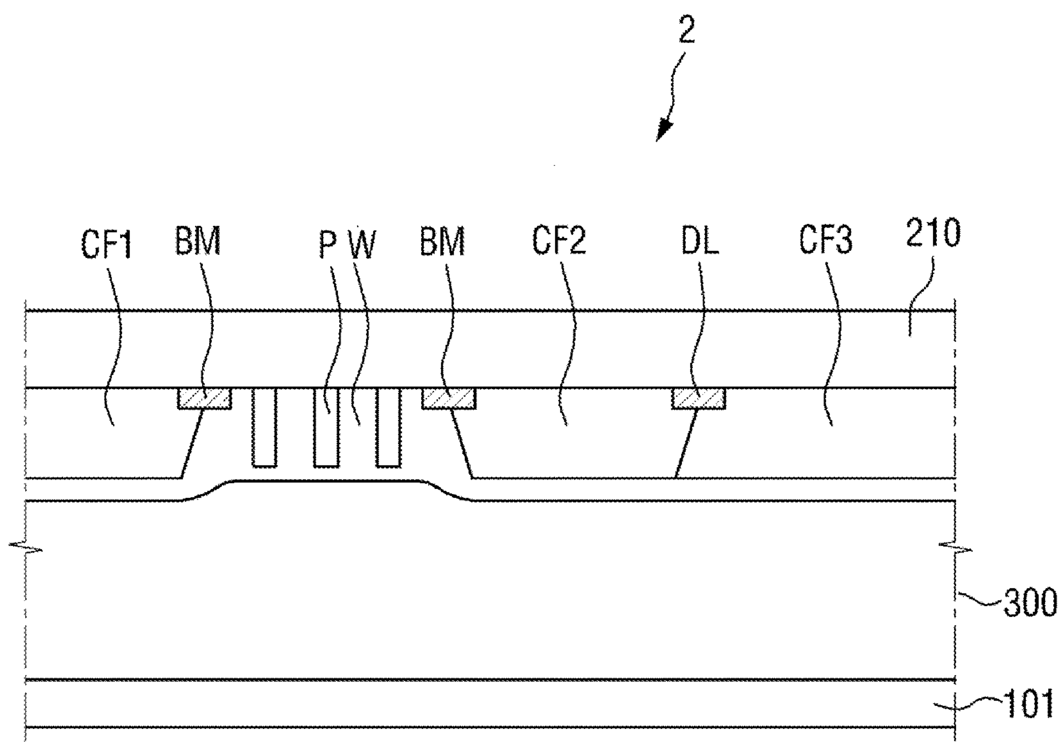
FIG. 7 is a schematic cross-sectional view of an LCD panel according to an exemplary embodiment of the present invention.
Figure 8:
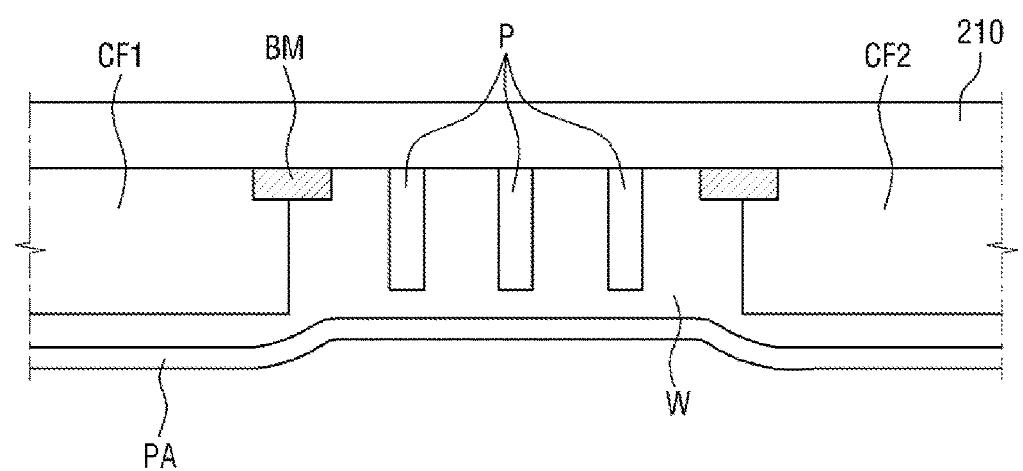
FIG. 8 is an enlarged cross-sectional view of a second substrate illustrated in FIG. 7.

FIG. 7 is a schematic cross-sectional view of an LCD panel 2 according to an exemplary embodiment of the present invention. FIG. 8 is an enlarged cross-sectional view of a second substrate 210 illustrated in FIG. 7.

Referring to FIG. 7, the LCD panel 2 may include a first substrate 101 and the second substrate 210 which face each other, a liquid crystal layer 300 which is interposed between the first substrate 101 and the second substrate 210, and color filters (CF1, CF2, CF3, and W) which are formed on the second substrate 210 and emit light of first through fourth colors. Any one of the color filters (CF1, CF2, CF3, and W) which emit the light of the first through fourth colors may include one or more columns P protruding from the second substrate 210.

The columns P may be included in the color filter W which emits the light of the fourth color, and the light of the fourth color may be white light. In addition, the color filters CF1, CF2, and CF3 may be color filters which emit red light, green light and blue light, i.e., the light of the first color, the light of the second color and the light of the third color, respectively. The columns P may be made of the same material as any one of the color filters CF1, CF2, and CF3 which emit the light of the first through third colors and do not include the columns P.

When the columns P are made of the material that forms the blue color filter CF3, the color filter W which is filled with a transparent material and includes the columns P may emit light of a color substantially similar to blue and white light. Accordingly, an LCD may display an image of a color substantially similar to blue. In this case, the displayed image may appear bluish when viewed from the side of the LCD that may improve the yellowish phenomenon and realize a superior color.

The color filter W which includes the columns P and emits the light of the fourth color may cover other color filters CF1, CF2, and CF3 which emit the red light, the green light and the blue light and do not include the columns P. More particularly the color filters CF1, CF3, and CF3 without the columns P may be interposed between the second substrate 210 and the color filter W including the columns P.

Referring to FIG. 8, a black matrix BM may be formed at boundaries between the color filters (CF1, CF2, CF3, and W) to prevent color mixing between pixels. A common electrode PA may be formed under the color filters (CF1, CF2, CF3, and W).

Although not illustrated, an insulating layer (not illustrated) or a planarization layer (not illustrated) may be interposed between the color filters (CF1, CF2, CF3, and W) and the common electrode PA. The common electrode PA may be made of a transparent conductive material and provided with a common voltage. The planarization layer can be omitted.

The first substrate 101 may be a TFT array substrate, and a pixel electrode (not illustrated) may be formed on the first substrate 101. When an electric field is not formed between the pixel electrode and the common electrode PA, the LCD panel 2 may display a black image. When the electric field is formed between the pixel electrode and the common electrode PA, the LCD panel 2 may display images of various gray levels.

When an electric field is not formed between the pixel electrode and the common electrode PA, liquid crystals of the liquid crystal layer 300 may be arranged in a direction perpendicular to a surface of the TFT array substrate 101. When the electric field is formed between the pixel electrode and the common electrode PA, the liquid crystals of the liquid crystal layer 300 may tilt at an angle with respect to the surface of the TFT array substrate 101. As the intensity of the electric field increases, the tilt angle of the liquid crystals may increase. Accordingly, the liquid crystals may be arranged in a direction horizontal to the surface of the TFT array substrate 101.

A height of each of the columns P, which is a distance each of the columns P extending from the second substrate 210 toward the first substrate 101, may be equal to or smaller than those of other color filters CF1, CF2, and CF3 without the columns P.

A distance F between a column P and another column P may be in a range of 10 to 40 μm, for example, in a range of 20 to 30 μm. If the distance F between the columns P is 10 μm or less, the unique color of the color filter W including the columns P may be excessively discolored, resulting in reduced transmittance. On the other hand, if the distance F between the columns P is more than 40 μm, a step difference between the color filter W including the columns P and an adjacent color filter may increase. Therefore, the yellowing phenomenon may be observed from the side.

Figure 9:
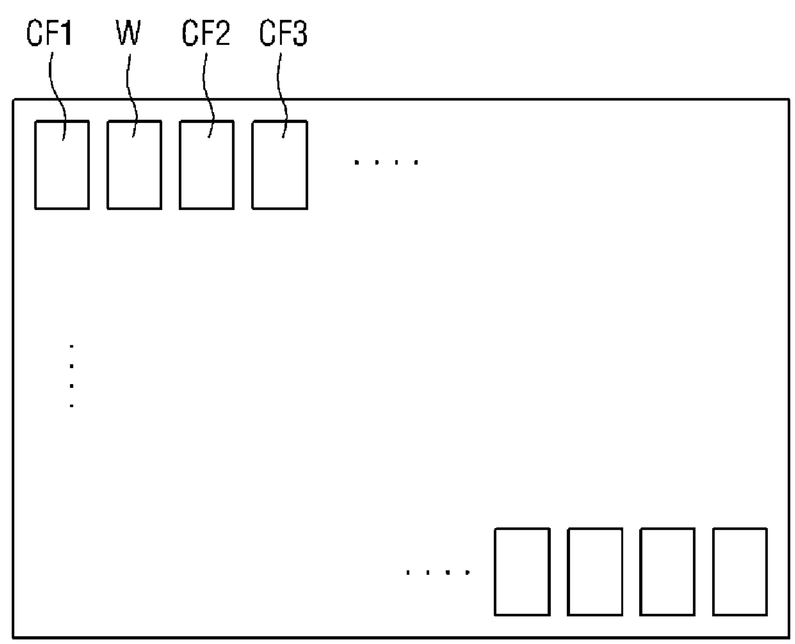
FIG. 9 is a schematic plan view illustrating the arrangement of pixels of an LCD panel according to an exemplary embodiment of the present invention.
Figure 10:
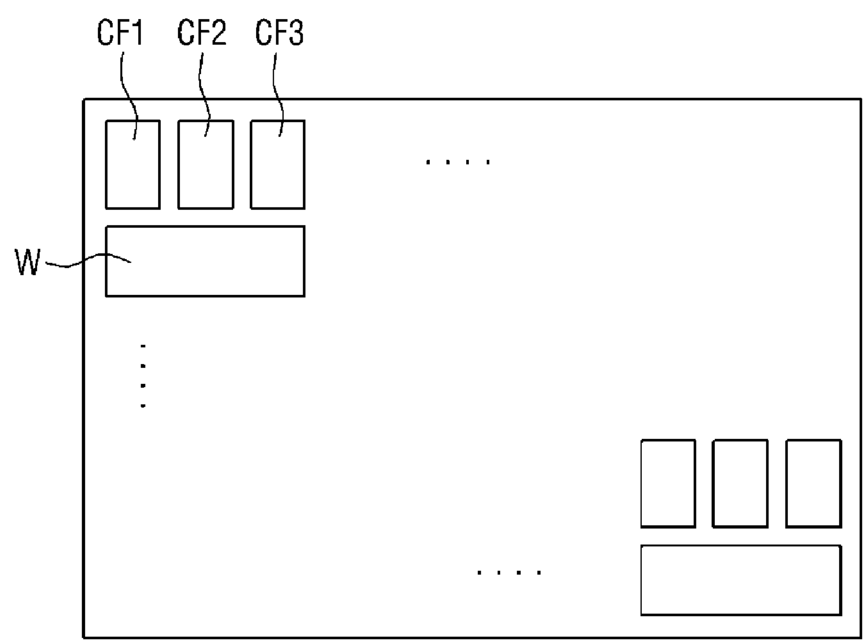
FIG. 10 is a schematic plan view illustrating the arrangement of pixels of an LCD panel according to an exemplary embodiment of the present invention.

FIG. 9 is a schematic plan view illustrating the arrangement of color filters formed in different pixels of an LCD panel according to an exemplary embodiment of the present invention. FIG. 10 is a schematic plan view illustrating the arrangement of color filters formed in different pixels of an LCD panel according to an exemplary embodiment of the present invention.

Referring to FIGS. 9 and 10, pixels and color filters (CF1, W, CF2 and CF3) formed in the pixels may be sequentially and repeatedly arranged on an LCD panel in a row direction, and one or more columns may be formed in any one of the color filters (CF1, CF2, CF3, and W). According to an exemplary embodiment of the present invention, referring to FIG. 10, the color filters CF1, CF2, and CF3 without the columns may be sequentially and repeatedly arranged in the row direction, and the color filter W including the columns may be formed under the color filters CF1, CF2, and CF3 in a column direction. The arrangement of the pixels and the arrangement of the color filters (CF1, CF2, CF3, and W) included in the pixels may be varied as desired by those of ordinary skill in the art.

FIGS. 11 through 14 are plan views illustrating patterns in which columns P are arranged in a pixel. Referring to FIGS. 11 through 14, a pixel is defined by data lines DL and gate lines GL, and columns P are formed in a color filter disposed in the pixel.

Figure 11:
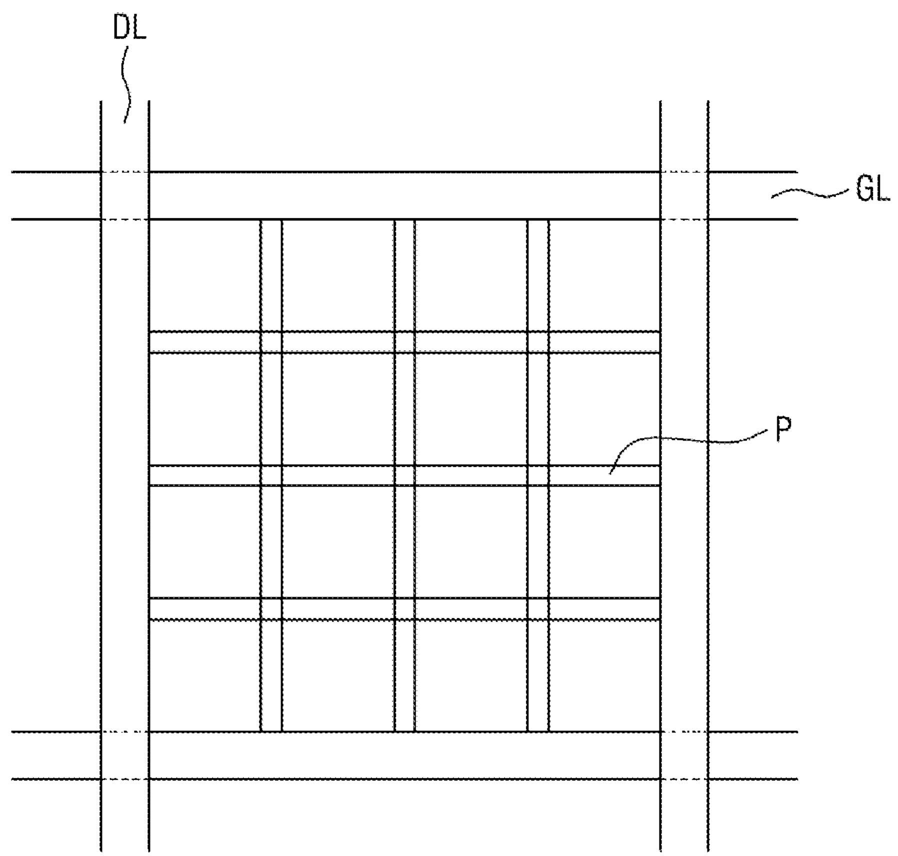
FIG. 11 is a schematic plan view of a pixel according to an exemplary embodiment of the present invention.
Figure 12:
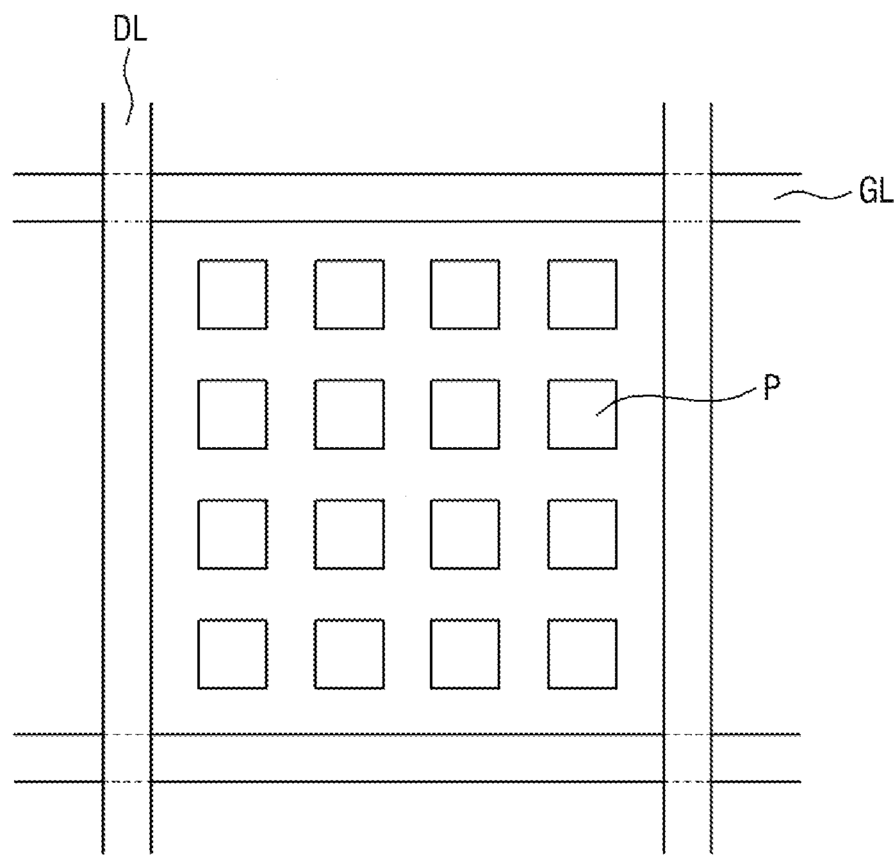
FIG. 12 is a schematic plan view of a pixel according to an exemplary embodiment of the present invention.
Figure 13:
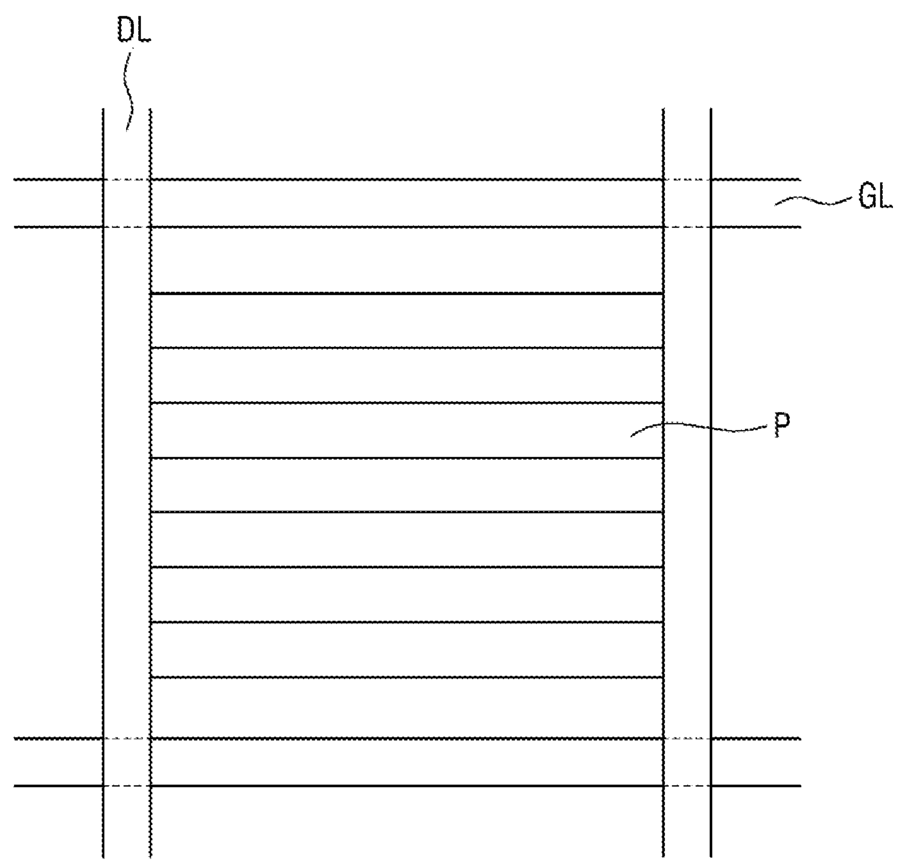
FIG. 13 is a schematic plan view of a pixel according to an exemplary embodiment of the present invention.
Figure 14:
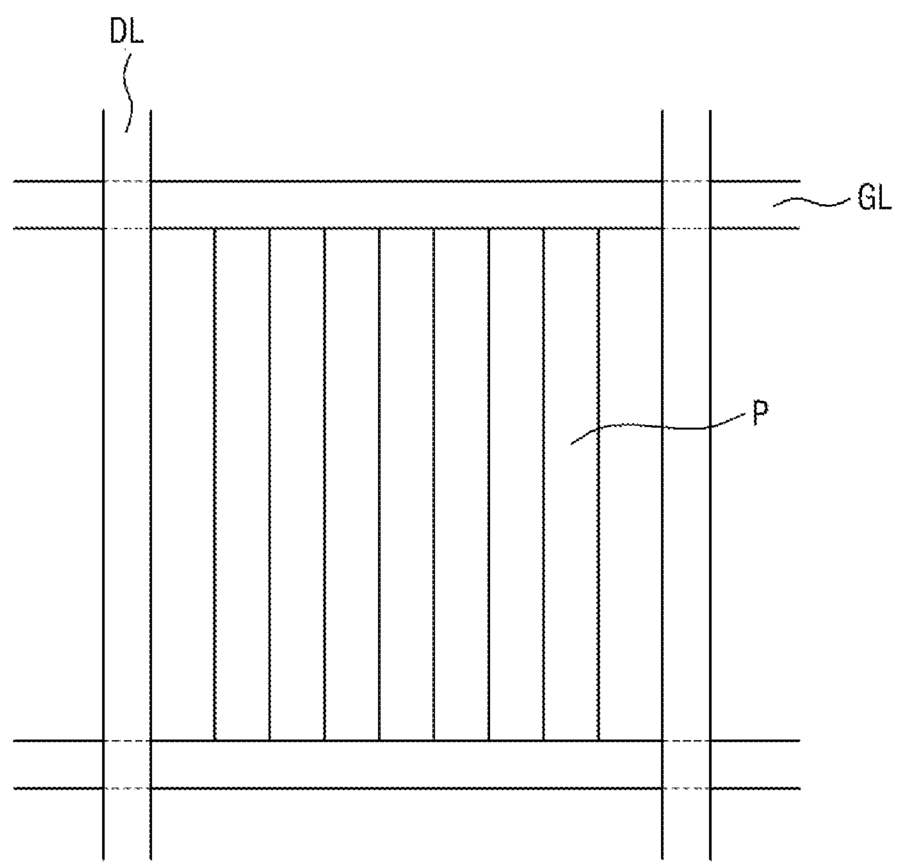
FIG. 14 is a schematic plan view of a pixel according to an exemplary embodiment of the present invention.

The columns P may be arranged in a lattice pattern as illustrated in FIG. 11. More particularly, the columns P may be formed to be separated from each other in a column direction, and the columns P may be formed to be separated from each other in a row direction. Alternatively, referring to FIG. 12, the columns P may be arranged at regular intervals. Alternatively, referring to FIGS. 13 and 14, the columns P formed in the row direction may be arranged parallel to each other in the row direction, or the columns P formed in the column direction may be arranged parallel to each other in the column direction.

The pattern in which the columns P are arranged may not be limited to the exemplary embodiments of the present invention illustrated with reference to FIGS. 11 through 14, and the columns P may be arranged irregularly, in a curved pattern, or in a single column. The arrangement pattern of the columns P and the number of the columns P may be adjusted variously as long as an aperture ratio of the color filter including the columns P is satisfied.

Hereinafter, a method of manufacturing an LCD panel according to an exemplary embodiment of the present invention will be described.

A method of manufacturing an LCD panel according to an exemplary embodiment of the present invention may include preparing a TFT array substrate and a second substrate which faces the TFT array substrate, forming color filters which emit light of first through third colors on the TFT array substrate or the second substrate, and forming a color filter which emits light of a fourth color on the TFT array substrate or the second substrate.

More particularly, the color filters may be formed on a first substrate or the second substrate. The first substrate may be the TFT array substrate. When the color filters are formed on the first substrate, a dislocation between the color filters formed in different pixels may be reduced as compared with when the color filters are formed on the second substrate.

The light of the fourth color may be white light, and one or more columns may be formed in the color filter which emits the white light. The columns may be formed when forming of the color filters which emit the light of the first through third colors. More particularly, the color filters which emit the light of the first through third colors may be formed using a photoresist method known in the art. The columns may be formed in a space for the color filter which emits the white light when any one of the color filters which emit the light of the first through third color is formed using the photoresist method.

The color filter which emits the white light (i.e., the light of the fourth color) that includes the columns may be formed without a photoresist process. More specifically, the color filter which emits the white light may be formed by coating a transparent material on the color filters which emit the light of the first through third colors and in the space where the color filter which emits the light of the fourth color, using a deposition or sputtering process. Therefore, the color filter which emits the white light (i.e., the light of the fourth color) may be formed after all of the color filters which emit red light, green light, and blue light are formed.

Generally, in a process such as a deposition or sputtering process, a material for forming a color filter may be evenly coated. Therefore, there may be a large step difference between the color filter which is formed by evenly coating the transparent material and emits the white light and the color filters which emit the red light, the green light, and the blue light. The large step difference between the color filters which emit the red light, the green light, and the blue light and the color filter which emits the white light may cause the yellowish phenomenon, which causes an image to appear yellowish when viewed from the side of an LCD. The yellowish phenomenon may become more noticeable as the step difference increases.

In the method of manufacturing an LCD panel according to an exemplary embodiment of the present invention, since the columns may be formed in the color filter which emits the white light, the step difference between the color filter which emits the white light and an adjacent color filter may be reduced, and accordingly, the yellowish phenomenon at a lateral viewing angle due to the step difference may be improved.

In a photoresist process, masks are generally used, and exposure and etching processes are performed using the masks to remove materials of unnecessary portions. The photoresist process using the masks may require the exposure and etching processes, and may also incur a waste of materials for the unnecessary portions. According to an exemplary embodiment of the present invention, the color filter which emits the white light may be formed without the photoresist process. Therefore, the number of masks used may be reduced, thereby simplifying the manufacturing process thereof. In addition, since the step difference between color filters may be reduced despite a reduction in the number of masks used, a change in color may be minimized.

The method of manufacturing an LCD panel according to an exemplary embodiment of the present invention may further include etching the color filter which includes the columns and emits the light of the fourth color after the forming of the color filter which includes the columns and emits the light of the fourth color. The color filter which includes the columns and emits the light of the fourth color may become flatter in the etching process.

More particularly, the color filter which emits the white light (i.e., the light of the fourth color) is formed by coating a material on the columns and the color filters which emit the red light, the green light, and the blue light. The color filter which emits the light of the fourth color may be uneven due to the shape and arrangement of the columns. The etching process may improve the flatness of portions between the color filters and an upper surface of the color filter which emits the light of the fourth color.

Figure 15:
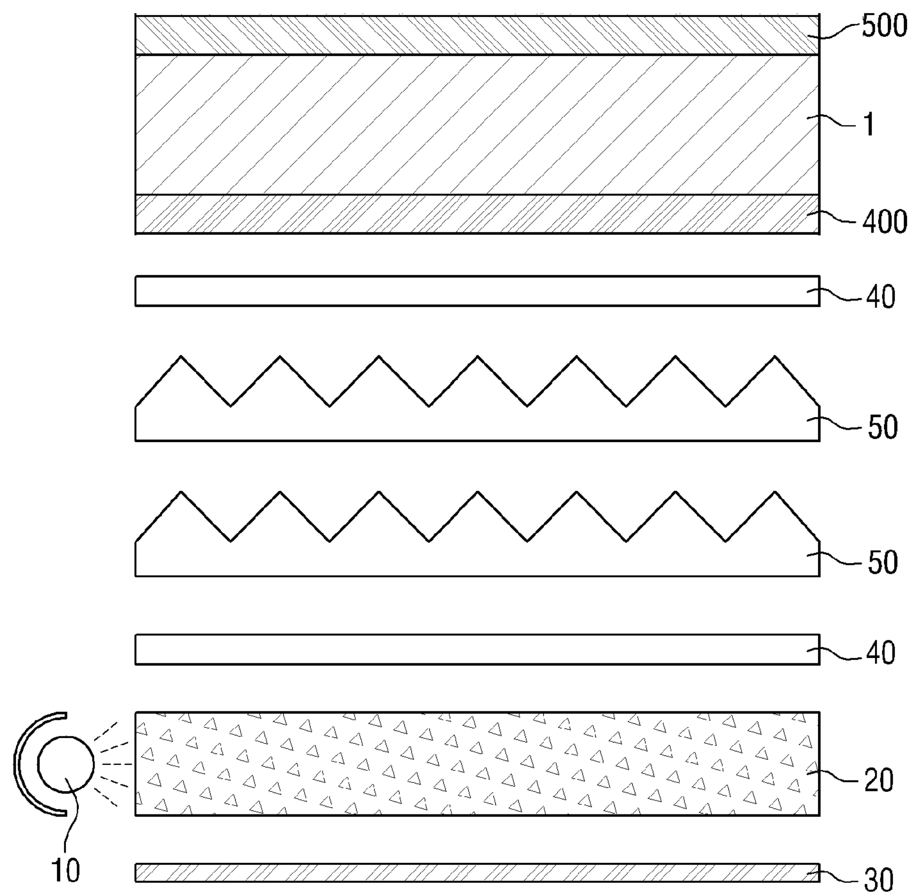
FIG. 15 is a schematic cross-sectional view of an LCD according to an exemplary embodiment of the present invention.

FIG. 15 is a schematic cross-sectional view of an LCD according to an exemplary embodiment of the present invention.

Referring to FIG. 15, the LCD may include the LCD panel manufactured according to the exemplary embodiment of the present invention described above. A lower polarizer 400 may be located under the LCD panel 1, and an upper polarizer 500 may be located on the LCD panel 1. Transmission axes of the upper polarizer 500 and the lower polarizer 400 may be orthogonal or parallel to each other. Any one of the upper polarizer 500 and the lower polarizer 400 may be omitted.

The LCD may include a light source 10, a light guide plate (LGP) 20 which is disposed on a side of the light source 10 and guides light from the light source 10 toward the LCD panel 1, a reflection sheet 30 which is located on a lower surface of the LGP 20 and reflects light propagating downward from the LGP 20 toward the LCD panel 1, and a diffusion sheet 40 and a prism sheet 50 which are located between the LGP 20 and the LCD panel 1 to increase optical characteristics.

More specifically, the LGP 20 changes the path of light generated by the light source 10 toward the LCD panel 1. The LGP 20 may include an incident surface upon which light generated by the light source 10 is incident and an exit surface which faces the LCD panel 1. The LGP 20 may be made of a material having light-transmitting properties such as polymethyl methacrylate (PMMA) or a material having a certain refractive index such as polycarbonate (PC).

Light incident upon a side surface or both side surfaces of the LGP 20 may have an angle smaller than a critical angle of the LGP 20. Thus, the light is delivered into the LGP 20. When the light is incident upon an upper or lower surface of the LGP 20, an incidence angle of the light may be greater than the critical angle. Thus, the light is evenly delivered within the LGP 20 without exiting from the LGP 20.

Scattering patterns may be formed on any one of the upper and lower surfaces of the LGP 20. For example, the scattering patterns may be formed on the lower surface of the LGP 20 which faces the exit surface so as to make guided light travel upward. More particularly, the scattering patterns may be printed on a surface of the LGP 20 using ink, such that light reaching the scattering patterns within the LGP 20 may exit upward from the LGP 20. The scattering patterns may be printed using ink as described above, or alternatively the scattering patterns may have various forms such as micro grooves or micro protrusions on the LGP 20.

The reflection sheet 30 may further be provided under the LGP 20. The reflection sheet 30 reflects light output from the lower surface (which faces the exit surface) of the LGP 20 back to the LGP 20. The reflection sheet 30 may be a film and made of a metal material that may reflect light. The reflection sheet 30 may be known to those of ordinary skill in the art, and thus a more detailed description thereof will be omitted.

The light source 10 may be a white light-emitting diode (LED) which emits white light or include LEDs which emit red (R) light, green (G) light, and blue (B) light. When the light source 10 includes LEDs which emit the red light, the green light, and the blue light, the LEDs may be turned on simultaneously to produce white light through color mixing.

The diffusion sheet 40 may diffuse a portion of light travelling from the light source 10 and send the diffused portion of the light to the LCD panel 1 thereabove and reflect the other portion of the light downward. According to an exemplary embodiment of the present invention, the diffusion sheet 40 may be made of one material including polymethyl methacrylate (PMMA), polystyrene (PS), polycarbonate (PC), cyclo-olefin copolymer (COC), polyethylene terephthalate (PET), polybutylene terephthalate (PBT), and a plastic alloy.

The diffusion sheet 40 may be placed on the upper surface of the LGP 20 as well as on the prism sheet 50, as illustrated in FIG. 15. Any one of the diffusion sheets 40 may be omitted, or two or more diffusion sheets 40 may be placed over each other at any one location. The number and placement of the diffusion sheets 40 may be changed as desired.

The prism sheet 50 may focus light travelling from the diffusion sheet 40 or the LGP 20 in a direction perpendicular to a plane of the LCD panel 1. Two or more prism sheets 50 placed over each other may be used as illustrated in FIG. 15.

Alternatively, only one sheet 50 may be used. The number and placement of the prism sheets 50 may be changed as desired.

In addition to the above-described optical plates, a micro-lens array film and a lenticular lens film may be used. The micro-lens array film and the lenticular lens film may be known to those of ordinary skill in the art, and thus a detailed description thereof will be omitted.

Although not illustrated, the LCD may include a bottom chassis, a middle frame, a top chassis, etc. The above optical plates may be located between the bottom chassis and the LCD panel 1, and the LCD panel 1 may be placed on the middle frame. In addition, the top chassis may be coupled to the bottom chassis while fixing the middle frame. Accordingly, the LCD panel 1 and the elements of the LCD may be fixed in position.

An LCD panel according to the exemplary embodiments of the he present invention may improve lateral visibility of the LCD by reducing a step difference between color filters and prevent a change in color when viewed from the side of the LCD and an LCD including the LCD panel.

In addition, the exemplary embodiments of the present invention may provide a method of manufacturing an LCD panel more simply, thereby reducing the manufacturing cost of the LCD panel.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A liquid crystal display (LCD) panel, comprising:

a first substrate and a second substrate facing each other;

a liquid crystal layer interposed between the first substrate and the second substrate;

color filters disposed on the first substrate, each color filter respectively configured to transmit light of one of first through fourth colors; and a pixel electrode disposed on the color filters, wherein:

a first color filter of the color filters is configured to transmit a white light, the first color filter covers a first column protruding from the first substrate and a second column protruding from the first substrate;

the first color filter is disposed on and covers second, third, and fourth color filters of the color filters;

the second, third, and fourth color filters are configured to transmit red light, green light, and blue light, respectively;

the first column, the second column, and the fourth color filter are made of a same material; and the first column and the second column overlap the pixel electrode.

2. The liquid crystal display panel of claim 1, wherein the first substrate is a thin-film transistor (TFT) array substrate.

3. The liquid crystal display panel of claim 1, wherein each of the first column and the second column protrudes from the first substrate toward the second substrate.

4. The liquid crystal display panel of claim 1, wherein:

a distance between the first column and the second column is in a range of 10 to 40 μm.

5. The liquid crystal display panel of claim 1, further comprising an insulating layer disposed on the color filters.

6. The liquid crystal display panel of claim 1, further comprising a black matrix disposed on and between the color filters.

* * * * *